(12) United States Patent
Kawaura et al.

(10) Patent No.: US 8,331,092 B2
(45) Date of Patent: Dec. 11, 2012

(54) COOLING APPARATUS FOR SEMICONDUCTOR ELEMENT

(75) Inventors: Masanori Kawaura, Aichi-ken (JP); Hirohito Matsui, Okazaki (JP); Tadafumi Yoshida, Kasugai (JP)

(73) Assignees: Toyota Jidosha Kabushiki Kaisha, Aichi-ken (JP); Nippon Soken, Inc, Aichi (JP)

( * ) Notice: Subject to any disclaimer, the term of this patent is extended or adjusted under 35 U.S.C. 154(b) by 241 days.

(21) Appl. No.: 12/943,417

(22) Filed: Nov. 10, 2010

(65) Prior Publication Data

US 2011/0108247 A1 May 12, 2011

(30) Foreign Application Priority Data

Nov. 12, 2009 (JP) ................... 2009-258986

(51) Int. Cl.
*H05K 7/20* (2006.01)
*F28D 7/00* (2006.01)
*H01L 23/34* (2006.01)

(52) U.S. Cl. .. 361/699; 165/80.2; 257/714; 257/E23.08; 361/717; 361/718

(58) Field of Classification Search ................ 257/714, 257/E23.08; 361/699, 717, 718
See application file for complete search history.

(56) References Cited

U.S. PATENT DOCUMENTS

| | | | | |
|---|---|---|---|---|
| 3,448,791 | A * | 6/1969 | Clark | 165/96 |
| 6,166,903 | A * | 12/2000 | Ranchy et al. | 361/690 |
| 6,234,239 | B1 * | 5/2001 | Azar | 165/80.3 |
| 6,351,384 | B1 * | 2/2002 | Daikoku et al. | 361/704 |
| 6,719,039 | B2 * | 4/2004 | Calaman et al. | 165/80.4 |
| 6,992,382 | B2 * | 1/2006 | Chrysler et al. | 257/717 |
| 7,839,641 | B2 * | 11/2010 | Baba et al. | 361/711 |
| 7,961,474 | B2 * | 6/2011 | Yoshida et al. | 361/719 |
| 8,213,179 | B2 * | 7/2012 | Yoshida et al. | 361/699 |
| 2007/0029665 | A1 * | 2/2007 | Lee et al. | 257/712 |
| 2010/0090336 | A1 * | 4/2010 | Yoshida et al. | 257/717 |
| 2012/0014066 | A1 * | 1/2012 | Morino et al. | 361/707 |

FOREIGN PATENT DOCUMENTS

| | | |
|---|---|---|
| JP | 1-204498 A | 8/1989 |
| JP | 6-188340 A | 7/1994 |
| JP | 2006-100293 A | 4/2006 |
| JP | 2008-16515 A | 1/2008 |
| JP | 2008-172014 A | 7/2008 |
| JP | 2010-129584 A | 6/2010 |

OTHER PUBLICATIONS

Japanese Office Action issued on Nov. 15, 2011 in Application No. JP2009-258986.

* cited by examiner

*Primary Examiner* — Gregory Thompson
(74) *Attorney, Agent, or Firm* — Sughrue Mion, PLLC

(57) ABSTRACT

A semiconductor element cooling apparatus includes: a first member whose first surface on which a semiconductor element is mounted, and whose second surface has fins that define coolant flow paths, and that extend in a first direction, and that stand from the second surface to a predetermined height, and that are spaced from each other by predetermined intervals; and a second member that defines the coolant flow paths that extend in the first direction. The fins have grooves which extend in a second direction that intersects the first direction, and which have a depth that extends from the distal end side of the fins toward the second surface. The depth of the grooves is smaller than the height of the fins. A protrusion-forming member is disposed in the grooves, and extends across adjacent fins, and forms protrusions in the coolant flow paths defined by the adjacent fins.

5 Claims, 3 Drawing Sheets

COOLING APPARATUS FOR SEMICONDUCTOR ELEMENT

BACKGROUND OF THE INVENTION

1. Field of the Invention

The invention relates to a cooling apparatus for a semiconductor.

2. Description of the Related Art

Cooling apparatuses deigned to cool elements that produce heat, such as semiconductor elements and the like, are known. Japanese Patent Application Publication No. 2006-100293 (JP-A-2006-100293) describes a cooling fin structure in which a surface that faces a heat source or a heat transfer surface is provided with protrusions that promote turbulent flows of a coolant to improve the heat transfer rate. Thus, the heat dissipation characteristic of the heat transfer surface is improved.

Japanese Patent Application Publication No. 2008-172014 (JP-A-2008-172014) describes a cooling structure that includes protrusions on the bottom surface of coolant flow paths that project into the interior of the coolant flow paths, and that induce turbulent flow of the coolant within the coolant flow paths.

As for the structure described in JP-A-2006-100293, because the configuration of the protrusions is complicated, the process for forming the protrusions requires a high-level technology, which increases the production cost. As for the structure described in JP-A-2008-172014, it is necessary to form beforehand protrusion portion regions that are protruded from inner wall surfaces that define the coolant flow paths into the coolant flow path, which also increases the production cost.

SUMMARY OF THE INVENTION

The invention provides a cooling apparatus for a semiconductor element that has a structure that minimizes the increase in production cost of the cooling apparatus.

An aspect of the invention relates to a semiconductor element cooling apparatus. The cooling apparatus includes: a first member having first surface on which a semiconductor element is mounted, and a second surface on which a plurality of fins that define a plurality of coolant flow paths; and a second member that defines the plurality of coolant flow paths that extend in a first direction, by closing spaces between the fins from a distal end side of the fins in a height direction of the fins. The plurality of fins formed on the second surface extend in the first direction by a predetermined height and are provided at predetermined intervals.

Grooves are formed in the fins and extend in a second direction that intersects the first direction. The grooves have a depth that extends from the distal end of the fins in the height direction toward the second surface side. The depth of the grooves is smaller than the height of the fins. A protrusion-forming member is disposed in the grooves, and extends across adjacent fins, and forms protrusions in the coolant flow paths defined by the adjacent fins.

BRIEF DESCRIPTION OF THE DRAWINGS

The features, advantages, and technical and industrial significance of this invention will be described below with reference to the accompanying drawings, in which like numerals denote like elements, and wherein.

DETAILED DESCRIPTION OF EMBODIMENTS

Figure 1:
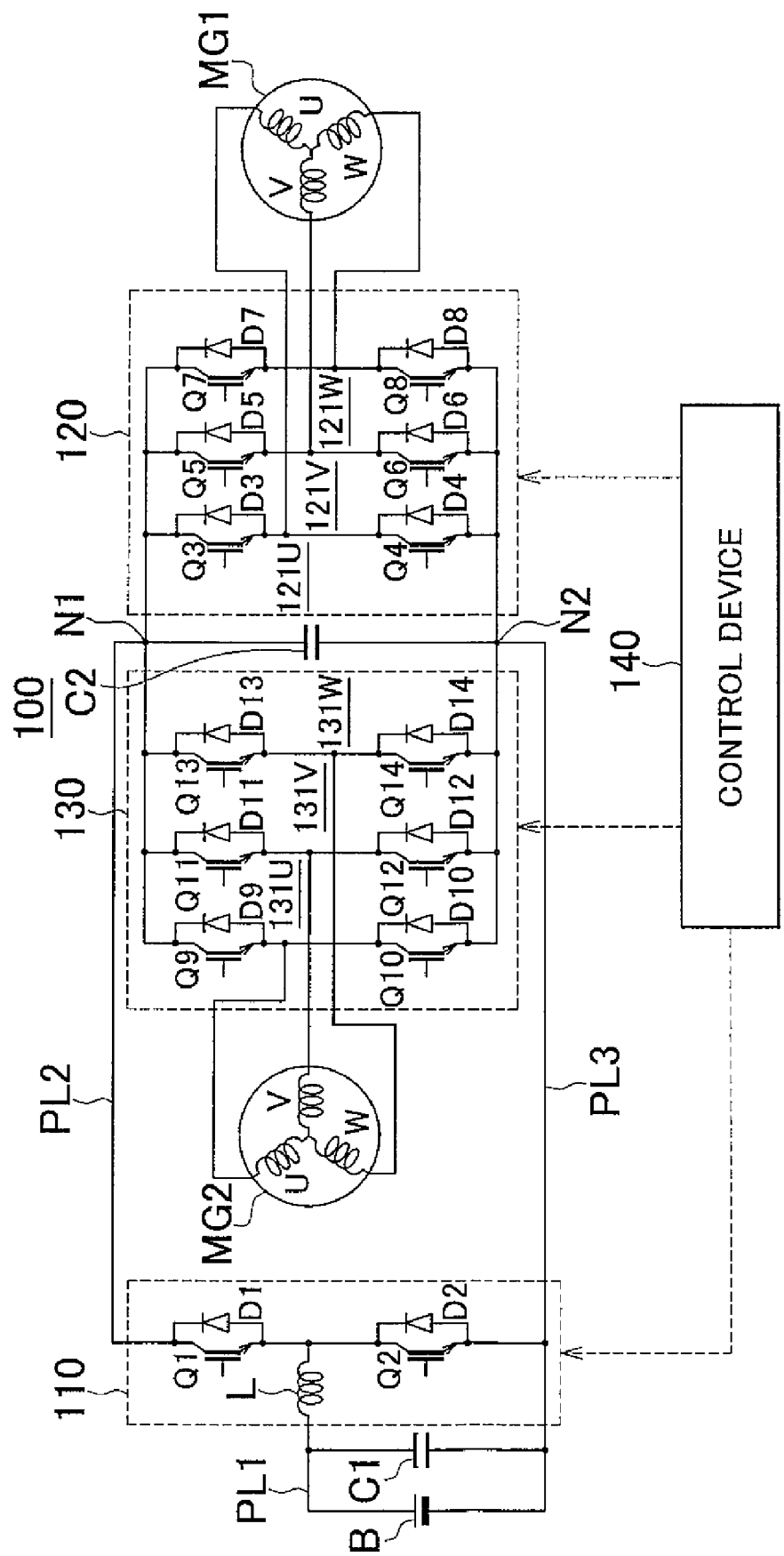
FIG. 1 is a circuit diagram showing the structure of portions of a PCU (power control unit) to which a cooling apparatus for a semiconductor element in accordance with an embodiment of the invention is applied.
Figure 2:
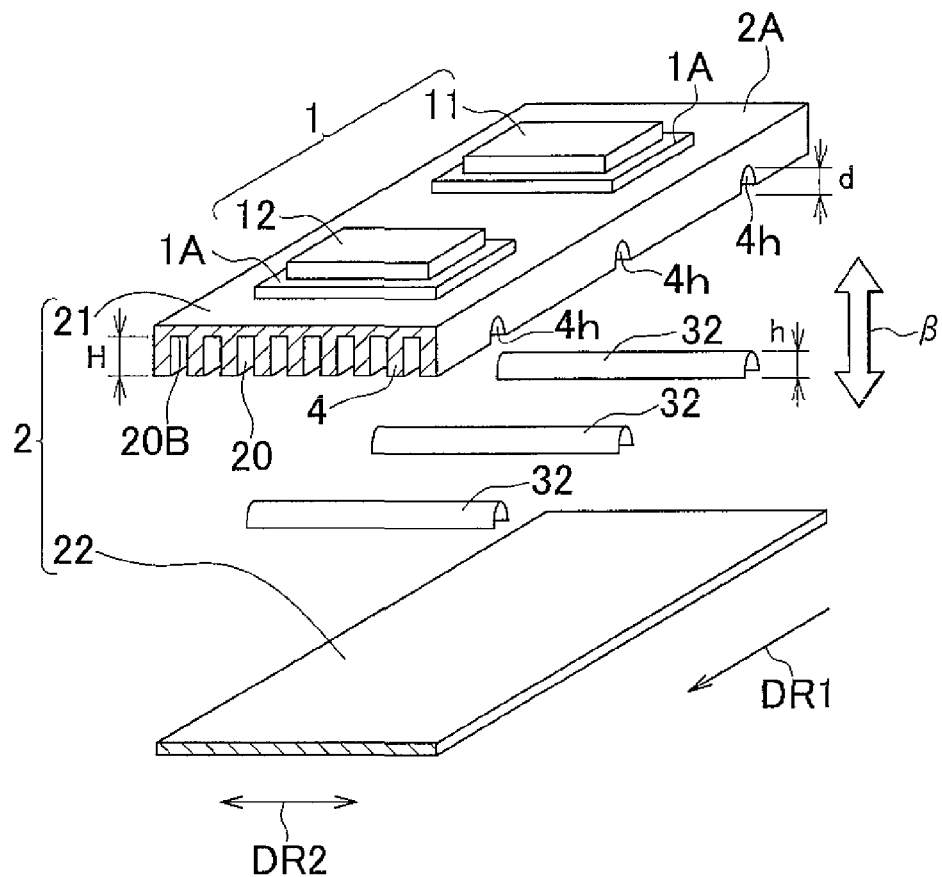
FIG. 2 is an exploded perspective view of a cooling structure for a semiconductor element.
Figure 3:
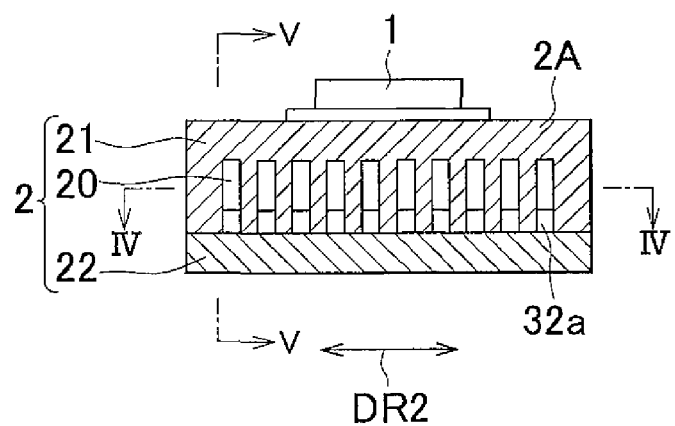
FIG. 3 is a sectional view showing a cooling apparatus for a semiconductor element.
Figure 4:
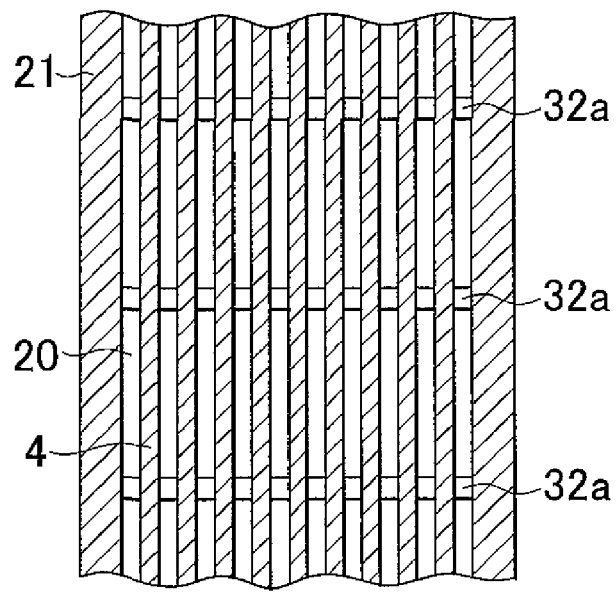
FIG. 4 is a sectional view taken as indicated by an arrowed line IV-IV in FIG. 3.

In the following description, the same or comparable portions and the like are denoted using the same reference characters, and repeated descriptions thereof are sometimes avoided. In addition, although numbers, quantities and the like are mentioned in conjunction with embodiments described below, it is to be understood that those numbers, quantities and the like do not necessarily limit the scope of the invention, unless otherwise stated. Furthermore, a plurality of embodiments or examples may be described below. In such cases, the configuration of the embodiments or examples may be combined as appropriate, unless otherwise stated.

FIG. 1 is a circuit diagram showing the structure of portions of a PCU (power control unit) to which a cooling apparatus for semiconductor elements in accordance with an embodiment of the invention is applied. Incidentally, a PCU 100 shown in FIG. 1 is a controller for a rotary electric machine that drives a vehicle.

Referring to FIG. 1, the PCU 100 includes a converter 110, inverters 120 and 130, a control device 140, and capacitors C1 and C2. The converter 110 is connected between a battery B and the inverters 120 and 130. The inverters 120 and 130 are connected to motor-generators MG1 and MG2, respectively.

The converter 110 includes power transistors Q1 and Q2, diodes D1 and D2, and a reactor L. The power transistors Q1 and Q2 are connected in series. Each of the transistors Q1 and Q2 receives, at its base, a control signal from the control device 140. The diodes D1 and D2 are connected between the collector side and the emitter side of the power transistors Q1 and Q2 to allow current to flow from the emitter side to the collector side of the power transistors Q1 and Q2, respectively. One end of the reactor L is connected to a first power supply line PL1, which is connected to a positive terminal of the battery B, and the other end of the reactor L is connected to a connecting point between the power transistors Q1 and Q2.

The converter 110, using the rector L, increases the direct-current voltage sent from the battery B to the converter 110, and supplies the current at the increased voltage to a second power supply line PL2. The converter 110 also reduces the direct-current voltage received from the inverters 120 and 130, and charges the battery B at the lowered voltage.

The inverters 120 and 130 include U-phase arms 121U and 131U, V-phase arms 121V and 131V, and W-phase arms 121W and 131W. The U-phase arm 121U, the V-phase arm 121V and the W-phase arm 121W of the inverter 120 are connected in parallel between a node N1 and a node N2. Likewise, the U-phase arm 131U, the V-phase arm 131V and the W-phase arm 131W of the inverter 130 are connected in parallel between the node N1 and the node N2.

The U-phase arm 121U includes two power transistors Q3 and Q4 that are connected in series. Likewise, the U-phase arm 131U, the V-phase arms 121V and 131V and the W-phase arms 121W and 131W each include two power transistors Q5 to Q14, respectively. Diodes D3 to D14 are connected between the collector side and the emitter side of the power transistors Q3 to Q14, respectively, to thereby allow current to flow from the emitter side to the collector side.

Intermediate points of the respective three-phase arms of the inverters 120 and 130 are connected to the corresponding phase ends of the three-phase coils of motor-generators MG1 and MG2. In each motor-generator MG1 and MG2, one-side ends of the three coils, that is, the U, V and W-phase coils, are interconnected at a midpoint.

The capacitor C1 is connected between the first power supply line PL1 and a third power supply line PL3, and smoothes the voltage level of the first power supply line PL1. The capacitor C2 is connected between the second and third power supply lines PL2 and PL3, and smoothes the voltage level of the second power supply line PL2.

The inverters 120 and 130 convert the direct-current voltage from the capacitor C2 into alternating-current voltage, and thereby drive the motor-generators MG1 and MG2 on the basis of drive signals from the control device 140.

The control device 140 computes the respective voltage of the three-phase coils of the motor-generators MG1 and MG2 based on a motor torque command value and three-phase current values of the motor-generators MG1 and MG2 as well as input voltages of the inverters 120 and 130. Then, based on the results of the computation, the control device 140 generates PWM (pulse width modulation) signals that turn on and off the power transistors Q3 to Q14, and then outputs the PWM signals to the inverters 120 and 130.

In addition, the control device 140 computes duty ratios of the power transistors Q1 and Q2 to optimize the input voltages of the inverters 120 and 130 based on the motor torque command value and the motor rotational speed. Then, based on the results of the computation, the control device 14 generates PWM signals that turn on and off the power transistors Q1 and Q2, and then outputs the signals to the converter 110.

The control device 140 also controls the switching operations of the power transistors Q1 to Q14 in the converter 110 and the inverters 120 and 130 to convert the alternating-current electric power, generated by the motor-generators MG1 and MG2, into direct-current electric power, and to charge the battery B with the direct-current electric power.

During operation of the PCU 100, the power transistors Q1 to Q14 and the diodes D1 to D14 that constitute the converter 110 and the inverters 120 and 130 produce heat. Therefore, there is a need to provide a cooling apparatus for cooling the semiconductor elements.

With reference to FIGS. 2 to 5, the structure of a cooling apparatus in accordance with the embodiment will be described. The semiconductor elements 1 may be, for example, the power transistors Q1 to Q14 and the diodes D1 to D14 shown in FIG. 1. In examples shown in FIGS. 2 to 5, a plurality of semiconductor elements 11 and 12 are shown as semiconductor elements 1.

The semiconductor elements 1 (11 and 12) are mounted on a cooling apparatus 2 via mounting structures 1A. The cooling apparatus 2 is constructed of a metal that has a relatively high heat transfer rate, such as copper, aluminum, or the like. The cooling apparatus 2 includes a first member 21 and a second member 22. Coolant flow paths 20 are formed between the first member 21 and the second member 22. A coolant is caused to flow in the coolant flow paths 20, thereby cooling the semiconductor elements 1.

The cooling apparatus 2 has a first member 21 that has a mounting surface (obverse face) 2A formed on a first surface thereof, on which semiconductor elements are mounted. A plurality of fins 4 that form a plurality of coolant flow paths 20 are formed on a second surface (reverse face) 20B of the first member 21. The fins 4 extend in a first direction (DR1), and project from the second surface 20B to a predetermined height, and are separated from one another by predetermined distances. The first member 21 includes a plurality of rectangular fins 4 and may be produced at relatively low cost through an extrusion process.

The cooling apparatus 2 has a flat second member 22 that defines the plurality of coolant flow paths 20 extending in the first direction (DR1) by closing the spaces between the fins 4 from a distal end side of the fins 4 in the height direction thereof (direction indicated by an arrow mark β). The second member 22 is fixed to the first member 21 with an adhesive or the like.

A plurality of grooves 4h extending in a second direction DR2, which intersects the first direction DR, are formed in the fins 4. The depth of the grooves 4h extends from the distal end side of the fins 4 in the height direction thereof to the second surface 20B side. Although in this embodiment, the first direction DR and the second direction DR2 are orthogonal to each other, they do not need to be orthogonal as long as the first direction DR intersects the second direction DR2.

The depth (d) of the grooves 4h is smaller than the height (H) of the fins 4. Protrusion-forming members 32 are disposed in the grooves 4h. The protrusion-forming members 32 extend across adjacent fins 4, and form protrusions 32a in the coolant flow paths 20 that are defined by the adjacent fins 4.

The protrusion-forming members 32 in this embodiment are formed by curving a flat member about its longitudinal axis as a rotation center. By curving the flat member, elastic restoring force, is generated in the flat member. Utilizing the elastic force, the protrusion-forming members 32 are fitted to internal surfaces of the grooves 4h. Furthermore, it is also possible to fix the protrusion-forming members 32 to the grooves 4h using an adhesive or the like.

Materials such as a spring plate, a resin plate, etc., may be used for the protrusion-forming members 32, as long as the members formed by curving the material in the above-described manner have elastic restoring force. In addition, it is preferable that the height (h) of the protrusion-forming members 32 when curved is equal to the depth (d) of the grooves 4h in order to prevent the coolant from flowing into the interior spaces of the curved protrusion-forming members 32 when the coolant is run through the coolant flow paths 20.

To maintain improved cooling efficiency, it is preferable that the height (h) of the protrusions 32a in the coolant flow paths 20 be about ⅓ to ¼ of the height (H) of the fins 4. In addition, the distance between the protrusions 32a is preferably about 5 to 10 times the height (h) of the protrusions 32a.

Figure 5:
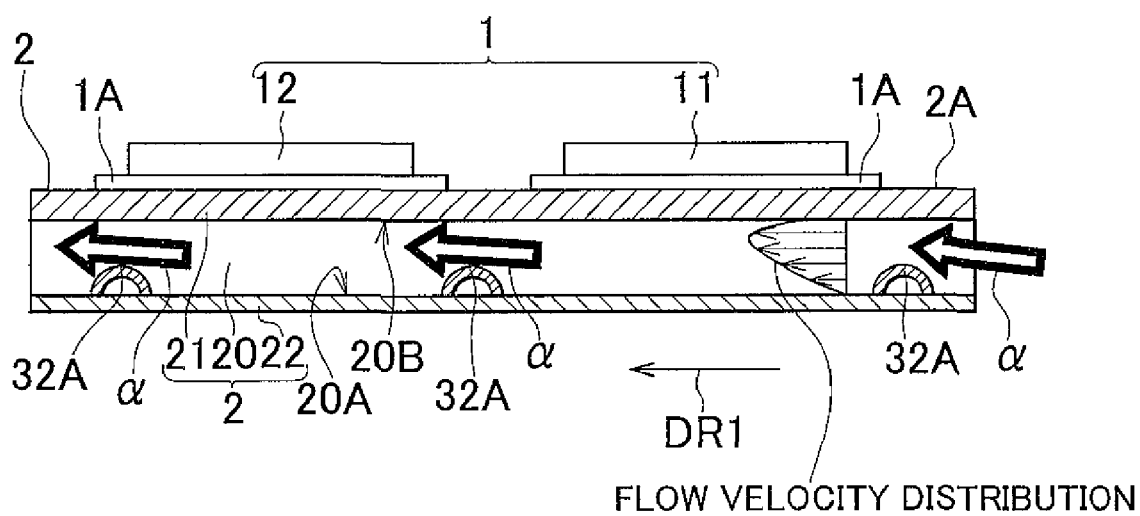
FIG. 5 is a sectional view taken as indicated by an arrowed line V-V in FIG. 3.

Next, the coolant flow in the cooling apparatus for semiconductor elements will be described with reference to FIG. 5. When coolant flows through the coolant flow paths 20 to cool the semiconductor elements 1, the flow velocity of the coolant near the wall surfaces of the coolant flow paths 20 tends to be low due to development of boundary layers. If the coolant should boil, bubbles may be formed on the second surfaces (reverse faces) 20B of the coolant flow paths 20 under the areas where the semiconductor elements 1 are mounted. Due to the decreased flow velocity of the coolant and the formation of bubbles at the second surface (reverse face) 20B of the coolant flow paths 20, the efficiency of cooling the semiconductor elements 1 decreases.

The embodiment of the invention improves the efficiency in cooling the semiconductor elements 1 by forming the protrusions 32a that extend in a direction that intersects the flow direction of the coolant (direction of an arrow DR1) and that protrude into the coolant flow paths 20 from bottom surfaces 20A of the coolant flow paths 20. The protrusions 32a are aligned in the direction indicated by the arrow DR1. It is preferable that the protrusions 32a be formed in portions of the coolant flow paths 20 that are located near the semiconductor elements 11 and 12.

The protrusions 32a are formed so as to provide at intervals and extend in a direction (direction of the arrow DR2) that intersects the flow direction of the coolant (i.e., so as to be parted by the fins 4). In an example shown in FIG. 5, protrusions 32a are formed upstream from each of the semiconductor elements 11 and 12. The arrows a in FIG. 5 show local flows of the coolant.

By providing the protrusions 32a as described above, it is possible to deflect the flow of the coolant at the mounting positions of the semiconductor elements 1 so as to create turbulence and increase the flow velocity of the coolant on the mounting surface of the semiconductor elements 1 and therefore restrain the development of boundary layers. As a result, the efficiency of cooling the semiconductor elements 1 is improved.

The positions of the protrusions 32a may be changed as appropriate, and typically are set so that the protrusions 32a are positioned upstream from each semiconductor element 1. For example, in the example shown in FIG. 5, the protrusions 32a that are provided upstream from the semiconductor element 12 are provided between the semiconductor elements 11 and 12 (i.e., downstream from the semiconductor element 11 and upstream from the semiconductor element 12).

The protrusions 32a may also overlap with the semiconductor elements 1. For example, the protrusions 32a shown in FIG. 5 may also be provided immediately under the semiconductor elements 11 and 12. In this case, too, substantially the same effects as described above may be expected, provided that the protrusions 32a are provided upstream from the center (in the direction indicated by the arrow DR1) of each of the semiconductor elements 11 and 12.

Because the protrusions 32a are provided at the above-described positions, the flow of the coolant through the coolant flow paths 20 is directed toward the semiconductor elements 1. The flows of the coolant directed toward the semiconductor elements 1 collide with the second surfaces (upper surface) 20B of the coolant flow paths 20 located immediately under the semiconductor elements 1, so that the bubble layers are destroyed. As a result, the efficiency of cooling the semiconductor elements 1 further improves.

Thus, according to the cooling apparatus in the foregoing embodiment and examples, it is possible to form the protrusions 32a in the coolant flow paths 20 merely by disposing the protrusion-forming members 32 in the grooves 4h formed in the fins 4. Accordingly, increases in the production cost are minimized, while maintaining high cooling efficiency of the semiconductor elements 1.

When the elastic force created by curving the protrusion-forming members 32 is utilized, it becomes possible to use the elastic force to fix the protrusion-forming members 32 in the grooves 4h formed in the fins 4. Therefore, the need to use an adhesive or the like is eliminated, and the increase of the production cost can be further restrained.

While the embodiments and examples of the invention have been described above, it is to be understood that the embodiments and examples disclosed herein are merely illustrative and not restrictive in any respect.

What is claimed is:

1. A semiconductor element cooling apparatus comprising:
    a first member with a first surface on which a semiconductor element is mounted, and a second surface on which a plurality of fins of a predetermined height that extend from the second surface, and that define a plurality of coolant flow paths are formed, wherein the fins extend in a first direction, and that are separated from each other by predetermined distances; and
    a second member that defines the plurality of coolant flow paths, by closing spaces between the fins from a distal end side of the fins in a height direction of the fins,
    wherein grooves are formed in the fins and extend in a second direction that intersects the first direction, and which have a depth that extends from the distal end side of the fins in the height direction toward the second surface, and
    wherein the depth of the grooves is smaller than the height of the fins, and a protrusion-forming member is disposed in the grooves, extends across adjacent fins of the plurality of fins, and forms protrusions in the coolant flow paths defined by the adjacent fins.

2. The semiconductor element cooling apparatus according to claim 1, wherein the protrusion-forming member is an elastic member, and is fitted to internal surfaces of the grooves by elastic force that the protrusion-forming member has.

3. The semiconductor element cooling apparatus according to claim 2, wherein the protrusion-forming member is caused to have the elastic force by curving the protrusion-forming member.

4. The semiconductor element cooling apparatus according to claim 1, wherein a height of the protrusions is ⅓ to ¼ of the height of the fins.

5. The semiconductor element cooling apparatus according to claim 1, wherein distance between the protrusions is 5 to 10 times the height of the protrusions.

* * * * *